(12) United States Patent
Yagi et al.

(10) Patent No.: US 8,263,174 B2
(45) Date of Patent: Sep. 11, 2012

(54) LIGHT EMITTING DEVICE AND METHOD FOR MANUFACTURING LIGHT EMITTING DEVICE

(75) Inventors: Yasushi Yagi, Hyogo (JP); Shingo Watanabe, Hyogo (JP); Toshihisa Nozawa, Hyogo (JP); Chuichi Kawamura, Aichi (JP); Kimihiko Yoshino, Aichi (JP); Tadahiro Ohmi, Miyagi (JP)

(73) Assignees: Tokyo Electron Limited, Tokyo (JP); National University Corporation Tohoku University, Miyagi (JP)

( * ) Notice: Subject to any disclaimer, the term of this patent is extended or adjusted under 35 U.S.C. 154(b) by 854 days.

(21) Appl. No.: 12/304,316

(22) PCT Filed: Jun. 13, 2007

(86) PCT No.: PCT/JP2007/061924
§ 371 (c)(1),
(2), (4) Date: Dec. 11, 2008

(87) PCT Pub. No.: WO2007/145255
PCT Pub. Date: Dec. 21, 2007

(65) Prior Publication Data
US 2009/0156084 A1 Jun. 18, 2009

(30) Foreign Application Priority Data
Jun. 14, 2006 (JP) .................. 2006-164965

(51) Int. Cl.
*B05D 5/06* (2006.01)
*B05D 5/12* (2006.01)
*C23C 16/00* (2006.01)
*H01J 9/00* (2006.01)

(52) U.S. Cl. ....... 427/66; 427/70; 427/109; 427/255.14; 427/255.23; 427/255.6; 445/58

(58) Field of Classification Search .................... 427/58, 427/64, 66, 69, 70, 96.1, 96.8, 108, 109, 427/123, 124, 125, 126.1, 126.2, 126.3, 248.1, 427/250, 255.11, 255.14, 255.15, 255.18, 427/255.19, 255.23, 255.26, 255.27, 255.28, 427/255.394, 255.395, 255.6, 255.7, 294, 427/331; 445/1, 46, 53, 58, 60, 73
See application file for complete search history.

(56) References Cited

U.S. PATENT DOCUMENTS
6,120,338 A * 9/2000 Hirano et al. .................. 445/24
(Continued)

FOREIGN PATENT DOCUMENTS
CN 1449229 A 10/2003
(Continued)

OTHER PUBLICATIONS
Korean Office action for 10-2008-7030439 dated Jun. 28, 2010.
(Continued)

*Primary Examiner* — Philip Tucker
*Assistant Examiner* — Brian R Slawski
(74) *Attorney, Agent, or Firm* — Pearne & Gordon LLP

(57) ABSTRACT

Disclosed is a light emitting device manufacturing apparatus including a plurality of processing chambers for performing a substrate processing for forming, on a target substrate, a light emitting device having multiple layers including an organic layer, wherein each of the plurality of processing chambers is configured to perform a substrate process on the target substrate while maintaining the target substrate such that its device forming surface, on which the light emitting device is to be formed, is oriented toward a direction opposite to a direction of gravity.

11 Claims, 12 Drawing Sheets

U.S. PATENT DOCUMENTS

| | | | |
|---|---|---|---|
| 2001/0002279 A1* | 5/2001 | Forrest et al. | 427/255.26 |
| 2002/0173068 A1* | 11/2002 | Kido et al. | 438/99 |
| 2005/0153058 A1* | 7/2005 | Tachikawa et al. | 427/66 |
| 2005/0196526 A1* | 9/2005 | Ishida | 427/66 |

FOREIGN PATENT DOCUMENTS

| | | |
|---|---|---|
| CN | 1450197 A | 10/2003 |
| CN | 1468972 A | 1/2004 |
| JP | 03162571 A | 7/1991 |
| JP | 2000-113981 A | 4/2000 |
| JP | 2004022401 A | 1/2004 |
| JP | 2005158392 A | 6/2005 |
| JP | 2005285576 A | 10/2005 |
| JP | 2006134825 A | 5/2006 |
| JP | 2007179797 A | 7/2007 |
| WO | 2007074563 A1 | 7/2007 |

OTHER PUBLICATIONS

Korean Office action for 10-2008-7030439 dated Dec. 28, 2010.
Chinese Office action for 200780021797.1 dated May 5, 2011.
Japanese Office action for 2006-164965 dated Jul. 19, 2011.
Chinese Office action for 200780021797.1 dated Aug. 31, 2011.

* cited by examiner (D)

(E)

(F)

(G)

LIGHT EMITTING DEVICE AND METHOD FOR MANUFACTURING LIGHT EMITTING DEVICE

TECHNICAL FIELD

The present invention relates to a method and an apparatus for manufacturing a light emitting device including an organic light emitting layer.

BACKGROUND ART

Recently, a flat display device capable of being made thin has been put to practical use in lieu of a conventionally used CRT (Cathode Ray Tube). An organic electroluminescence device (organic EL device), for example, has advantageous features such as self-luminescence, high-speed responsiveness, and so forth, so that it is recently attracting attention as a next-generation display device. Further, the organic EL device may also be used as a surface emitting device besides the display device.

The organic EL device includes an organic layer containing an organic EL layer (light emitting layer), which is interleaved between a positive electrode and a negative electrode. Holes from the positive electrode and electrons from the negative electrode are injected into the light emitting layer, and the light emitting layer emits light as a result of recombination of the holes and the electrons.

Further, in the organic layer, light emission efficiency can be improved by inserting a hole transport layer between the positive electrode and the light emitting layer and/or an electron transport layer between the negative electrode and the light emitting layer, as required.

A general method for forming the above-stated light emitting device is as follows. First, by a deposition method, an organic layer is formed on a substrate on which a positive electrode made of indium tin oxide (ITO) is patterned. Here, the deposition method is a method for forming a thin film by depositing, e.g., an evaporated or sublimated deposition source material on a target substrate. Subsequently, aluminum (Al) to be used as a negative electrode is formed on the organic layer by the deposition method or the like.

In this manner, the light emitting device including the organic layer formed between the positive electrode and the negative electrode is obtained (see, for example, Patent Document 1).

FIG. 1 schematically illustrates a deposition apparatus which constitutes a part of a conventional light emitting device manufacturing apparatus.

Referring to FIG. 1, the deposition apparatus 10 includes a processing chamber 11 having an inner space 11A defined therein. A deposition source 12 and a substrate holding table 15 facing the deposition source 12 are installed in the inner space 11A. The inner space 11A is exhausted by a gas exhaust pump or the like (not shown) through a gas exhaust line 14 and is maintained in a predetermined depressurized state.

The deposition source 12 includes a heater 13, and a source material 12A accommodated therein is heated by the heater 13. As a result, the source material 12A is evaporated or sublimated, thus generating a source gas G. The source gas is deposited on a target substrate S held on the substrate holding table 15.

By using the above-described film forming apparatus 10, the organic layer (light emitting layer) of the light emitting device, the electrode on the organic layer, or the like can be formed, for example.

Patent Document 1: Japanese Patent Laid-open Publication No. 2004-225058

DISCLOSURE OF THE INVENTION

Problems to be Solved by the Invention

In the conventional light emitting device manufacturing apparatus, however, when performing the film formation by, e.g., the deposition method, the target substrate needs to be maintained with its film forming surface facing downward (held face-down) in order to deposit, on the target substrate, the evaporated or sublimated source material from the deposition source in the processing chamber. Accordingly, in case that the target substrate is scaled up, handling of the target substrate becomes difficult, resulting in deterioration of productivity of the light emitting device.

Especially, along with the recent trend of scale-up of a flat panel display, the size of the display device using the light emitting device (organic EL device) is also getting enlarged. Therefore, the target substrate on which the light emitting device is formed also tends to be larger in its size, so that it becomes more and more difficult to handle the target substrate when transferring or setting it, for example.

Further, in case that a processing apparatus maintaining the substrate face-down and a processing apparatus maintaining the substrate face-up co-exist in a plurality of substrate processing steps for manufacturing the light emitting device, the transfer or the handling of the target substrate would become complicated, resulting in reduction of productivity and increase of manufacturing cost.

Besides, the likelihood of damage infliction on the target substrate also increases. Further, since a warpage amount of the target substrate needs to be taken into consideration sufficiently, there has been a concern that the deterioration of productivity may be resulted.

In view of the forgoing problems, the present invention is designed to provide a novel and useful manufacturing apparatus of a light emitting device, and a manufacturing method thereof.

It is, therefore, an object of the present invention to provide an apparatus and a method for manufacturing a light emitting device, capable of manufacturing a multi-layered light emitting device including an organic layer with high productivity.

Means for Solving the Problems

In accordance with a first aspect of the present invention, there is provided a light emitting device manufacturing apparatus including: a plurality of processing chambers for performing a substrate processing for forming, on a target substrate, a light emitting device having multiple layers including an organic layer, wherein each of the plurality of processing chambers is configured to perform a preset process on the target substrate while maintaining the target substrate such that its device forming surface, on which the light emitting device is to be formed, is oriented toward a direction opposite to a direction of gravity.

In accordance with a second aspect of the present invention, there is provided the manufacturing apparatus of the first aspect, further including: a transfer chamber(s) connected with the plurality of processing chambers, for transferring the target substrate to the plurality of processing chambers, wherein, in the transfer chamber(s), the target substrate is transferred while its device forming surface is oriented toward the direction opposite to the direction of gravity.

In accordance with a third aspect of the present invention, there is provided the manufacturing apparatus of the second aspect, wherein a multiplicity of the transfer chambers is further provided.

In accordance with a fourth aspect of the present invention, there is provided the manufacturing apparatus of any one of the first to third aspects, wherein the plurality of processing chambers includes: an organic layer forming chamber for forming the organic layer; and an electrode forming chamber for forming an electrode for applying a voltage to the organic layer.

In accordance with a fifth aspect of the present invention, there is provided the manufacturing apparatus of the fourth aspect, wherein the organic layer forming chamber is configured to successively form the organic layer having a multi-layered structure including a light emitting layer, which emits light as the voltage is applied thereto, by a deposition method.

In accordance with a sixth aspect of the present invention, there is provided the manufacturing apparatus of the fifth aspect, wherein the organic layer forming chamber includes: a holding table for holding thereon the target substrate; and a plurality of film forming source gas supply units for supplying a multiplicity of film forming source gases for a deposition onto the target substrate.

In accordance with a seventh aspect of the present invention, there is provided the manufacturing apparatus of sixth aspect, further including: a film forming source gas generation unit(s) for generating the film forming source gas(es) by evaporating or sublimating a deposition source material(s); and a supplying path(s) for supplying the film forming source gas(es) to the film forming source gas supply unit(s) from the film forming source gas generation unit(s).

In accordance with an eighth aspect of the present invention, there is provided the manufacturing apparatus of the seventh aspect, wherein a plurality of the film forming source gas generation units and a plurality of the supplying paths are provided so as to correspond to the plurality of film forming source gas supply units.

In accordance with a ninth aspect of the present invention, there is provided the manufacturing apparatus of the eighth aspect, wherein the holding table is configured to move along an arrangement direction of the plurality of film forming source gas supply units according to the film formation.

In accordance with a tenth aspect of the present invention, there is provided the manufacturing apparatus of any one of the fourth to ninth aspects, wherein, in the electrode forming chamber, the electrode is formed by a sputtering method using two targets facing each other.

In accordance with an eleventh aspect of the present invention, there is provided the manufacturing apparatus of any one of the first to tenth aspects, wherein the plurality of processing chambers includes an etching chamber for etching and patterning the organic layer.

In accordance with a twelfth aspect of the present invention, there is provided a light emitting device manufacturing method for forming, on a device forming surface of a target substrate, a light emitting device having multiple layers including an organic layer, the method including: a plurality of substrate processing steps respectively performed in a plurality of processing chambers. In the plurality of processing chambers, a process is performed on the target substrate while the device forming surface is oriented toward a direction opposite to a direction of gravity.

In accordance with a thirteenth aspect of the present invention, there is provided the manufacturing method of the twelfth aspect, wherein, in a transfer chamber connected with the plurality of processing chambers and transferring the target substrate to the plurality of processing chambers, the target substrate is transferred while maintaining the device forming surface to be oriented toward the direction opposite to the direction of gravity.

In accordance with a fourteenth aspect of the present invention, there is provided the manufacturing method of the thirteenth aspect, wherein the target substrate is transferred into the plurality of processing chambers via a multiplicity of the transfer chambers.

In accordance with a fifteenth aspect of the present invention, there is provided the manufacturing method of any one of the twelfth to fourteenth aspects, wherein the plurality of substrate processing steps includes: an organic layer forming step for forming the organic layer; and an electrode forming step for forming an electrode for applying a voltage to the organic layer.

In accordance with a sixteenth aspect of the present invention, there is provided the manufacturing method of the fifteenth aspect, wherein, in the organic layer forming step, the organic layer having a multi-layered structure including a light emitting layer, which emits light as the voltage is applied thereto, is successively formed by a deposition method.

In accordance with a seventeenth aspect of the present invention, there is provided the manufacturing method, wherein, in the organic layer forming step, a film formation of the organic layer is carried out in a film forming processing chamber including: a holding table for holding thereon the target substrate; and a plurality of film forming source gas supply units for supplying a multiplicity of film forming source gases for a deposition onto the target substrate.

In accordance with an eighteenth aspect of the present invention, there is provided the manufacturing method of the seventeenth aspect, wherein the film forming source gas(es) is supplied to the plurality of film forming source gas supply units via a supplying path(s) for supplying the film forming source gas(es) from a film forming source gas generation unit(s) for generating the film forming source gas(es) by evaporating or sublimating a deposition source material(s).

In accordance with a nineteenth aspect of the present invention, there is provided the manufacturing method, wherein the multiplicity of film forming source gases are respectively supplied to a plurality of film forming source gas supply units from a corresponding plurality of the film forming source gas generation units via a plurality of the supplying paths.

In accordance with a twentieth aspect of the present invention, there is provided the manufacturing method, wherein the holding table moves along an arrangement direction of the plurality of film forming source gas supply units according to the film formation.

In accordance with a twenty-first aspect of the present invention, there is provided the manufacturing method of any one of the fifteenth to twentieth aspects, wherein, in the electrode forming step, the electrode is formed by a sputtering method using two targets facing each other.

In accordance with a twenty-second aspect of the present invention, there is provided the manufacturing method of any one of the twelfth to twenty-first aspects, wherein the plurality of substrate processing steps includes an etching step for etching and patterning the organic layer.

Effect of the Invention

In accordance with the present invention, it becomes possible to provide an apparatus and a method for manufacturing a light emitting device, capable of manufacturing a multilayered light emitting device including an organic layer with high productivity.

EXPLANATION OF CODES

Figure 1:
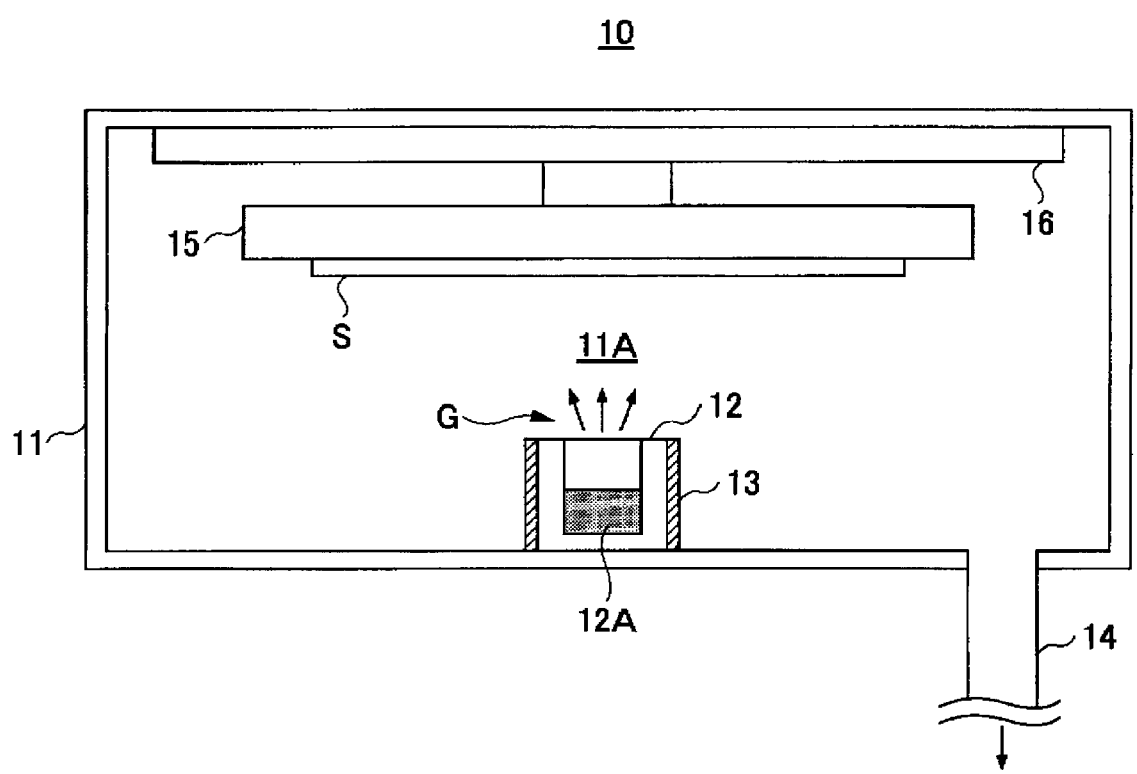
FIG. 1 is an example of a conventional light emitting device manufacturing apparatus.

200: Light emitting device
201: Substrate
201A: Device formation surface
202: Positive electrode
203: Outgoing line
204: Organic layer
205: Negative electrode
205a: Connection line
206, 206a: Protection films
EL1, SP1, SP2, SP3, ET1, CVD1, CVD2: Processing chambers
CLN1, CLN2: Cleaning processing chambers
M1, M2, M3, M4: Mask processing chambers
L1, L2, L3, L4: Load lock chambers
TM1, TM2, TM3, TM4, TM5, TM6, TM7, TM8, TM1A, TM2A, TM3A: Transfer chambers

BEST MODE FOR CARRYING OUT THE INVENTION

Hereinafter, embodiments of the present invention will be described with reference to the accompanying drawings.

A manufacturing apparatus of a light emitting device in accordance with an embodiment of the present invention includes a plurality of processing chambers for performing a substrate processing on a target substrate, for forming a multilayered light emitting device including an organic layer. In these processing chambers, a preset substrate processing is performed while keeping the target substrate's device formation surface, on which the light emitting device is to be formed, oriented toward an opposite direction to the direction of gravity.

Therefore, in the manufacturing apparatus of the light emitting device in accordance with the embodiment of the present invention, it becomes possible to form the light emitting device while maintaining the target substrate face-up in the plurality of processing chambers. Accordingly, the above-mentioned manufacturing apparatus of the light emitting device is capable of handling a large-size target substrate easily.

In the above-cited manufacturing apparatus of the light emitting device, since the large-size target substrate need not be maintained face-down, a device for holding the target substrate against the gravity such as an electrostatic holding device (e.g., an electrostatic chuck (ESC)) becomes unnecessary. If this manufacturing apparatus is used in a manufacturing process of the light emitting device, there occurs no occasion of co-existing an apparatus which maintains the substrate face-down and an apparatus which maintains the substrate face-up. Thus, an operation of turning the target substrate upside down or the like becomes unnecessary, so that the probability of damage infliction upon the large-size target substrate decreases. Further, since excessive consideration of the warpage amount of the large-size target object is not necessitated, the productivity of the light emitting device using the large-size target substrate further enhances.

Moreover, in the present specification, the term "face-up process" means a substrate processing in which the target substrate is processed while its device formation surface on which the light emitting device is to be formed is oriented toward the opposite direction to the direction of gravity. That is, a substrate processing such as film formation, etching, surface processing, or the like in which the target substrate is maintained with its processing surface oriented toward the direction opposite to the direction of gravity is referred to as a face-up film formation, a face-up etching, or the like, and the substrate is referred to as "being maintained face-up".

In the aforementioned light emitting device manufacturing apparatus, in a processing chamber (film forming chamber) which performs, e.g., a deposition method, a face-up process (face-up film formation) is enabled by generating a film formation source material in a gaseous state by evaporating or sublimating a source material for film formation and then by carrying and supplying the film formation source material onto the target substrate. This manufacturing apparatus will be described later.

Below, an example of a light emitting device manufacturing method, which is performed by the aforementioned manufacturing apparatus, will be described in sequence with reference to the accompanying drawings.

First Embodiment

A light emitting device manufacturing method in accordance with a first embodiment of the present invention will be explained in sequence with reference to FIG. 2 (A to C), FIG. 3 (D to E) and FIG. 4 (F and G). In the drawings, like parts will be assigned like reference numerals, and redundant description thereof will be omitted.

Figure 2:
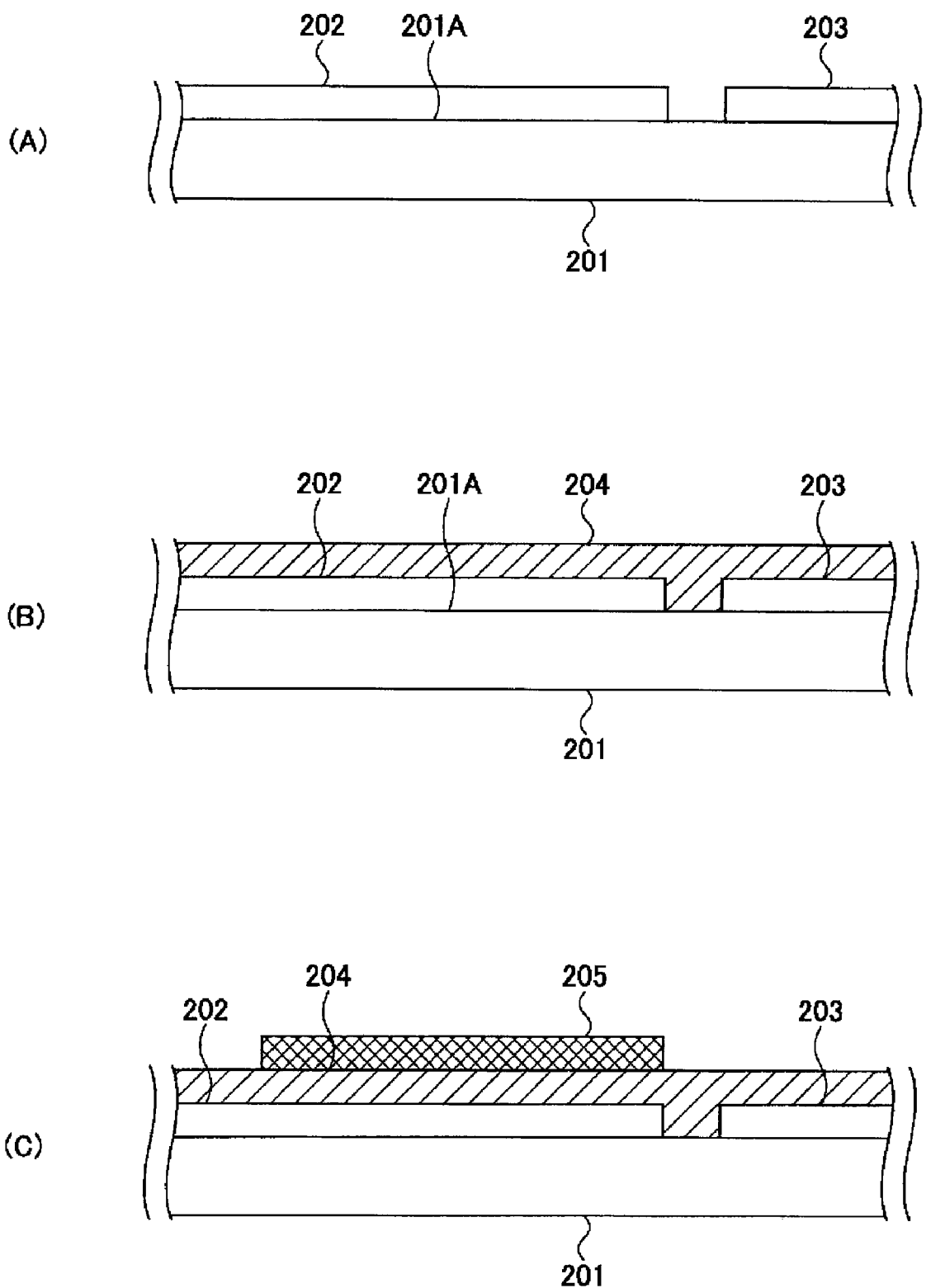
FIG. 2 (A to C) is a part of a light emitting device manufacturing method in accordance with a first embodiment.

First, in a process shown in FIG. 2 (A), a substrate provided with an electrode is prepared. The substrate includes a transparent substrate 201 made of, e.g., glass; a positive electrode 202 made of a transparent material such as ITO and formed on substrate 201's one surface (device formation surface) 201A on which a device is to be formed; and an outgoing line 203 electrically connected with a negative electrode to be formed in a following process. In this case, the positive electrode 202 and the outgoing line 203 are formed by, for example, a sputtering method or the like.

Further, the substrate 201 may have a control device such as TFT or the like embedded in the side of the device formation surface 201A, for controlling light emission of the light emitting device. For example, in case of using the light emitting device formed by the embodiment of the present invention in a display device, the control device such as TFT or the like may be embedded in every pixel.

In such case, a source electrode of the TFT is connected with the positive electrode 202, while a gate electrode and a drain electrode of the TFT are connected with a gate line and a drain line formed in lattice shapes, respectively, so that a display control is performed for every pixel. In this case, the outgoing line 203 is connected with a certain control circuit (not shown). A driving circuit of such display device is called an active matrix driving circuit. Further, in the present drawings, illustration of the active matrix driving circuit is omitted.

Then, in a process shown in FIG. 2 (B), an organic layer 204 containing a light emitting layer (organic EL layer) is formed on the positive electrode 202, the outgoing line 203 and the substrate 201 by the deposition method so as to cover the positive electrode 202, the outgoing line 203, and an exposed portion of the device formation surface 201A of the substrate 201. In this case, the organic layer 204 is formed over substantially entire surface of the substrate without using a mask.

In this process, the organic layer 204 is formed by a face-up film formation. Since deposition is performed while maintaining the substrate face-up, the manufacturing apparatus of the light emitting device in accordance with the embodiment of the present invention is configured to transport the film formation source gas in a gaseous state to above the substrate 201 and supply it from there to the substrate 201. Such manufacturing apparatus in accordance with the embodiment of the present invention will be described later.

Subsequently, in a process shown in FIG. 2 (C), a negative electrode 205 made of, e.g., Ag is formed on the organic layer 204 by, for example, a sputtering using a pattern mask. By using the pattern mask, the negative electrode 205 is provided with a preset pattern. Further, the negative electrode 205 having the preset pattern may be formed by employing an etching method using a photolithography technique after forming the negative electrode 205 over the entire surface. Further, the electrode 205 may have a multi-layered structure including an Ag layer and an Al layer. In this process, the negative electrode 205 is formed by a face-up film formation as well.

Figure 3:
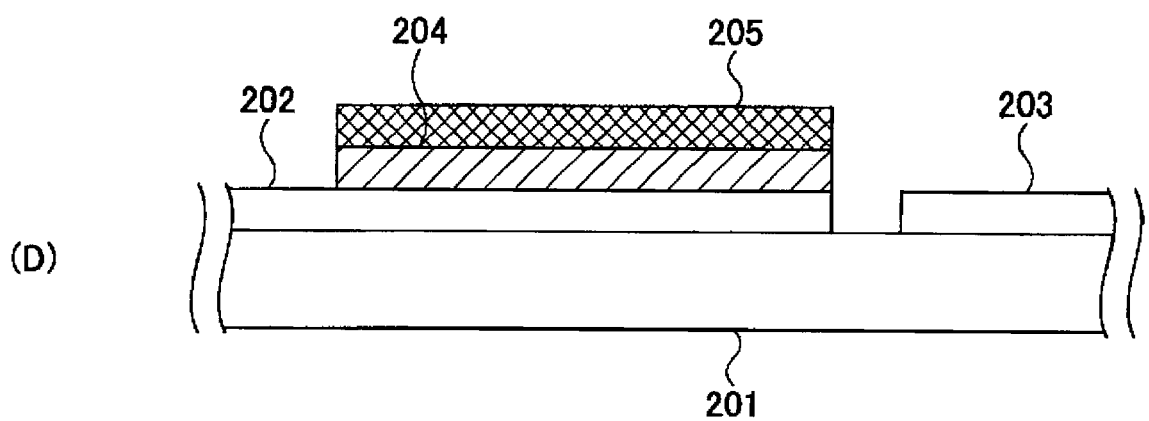
FIG. 3 (D to E) is another part of the light emitting device manufacturing method in accordance with the first embodiment.
Figure 3:
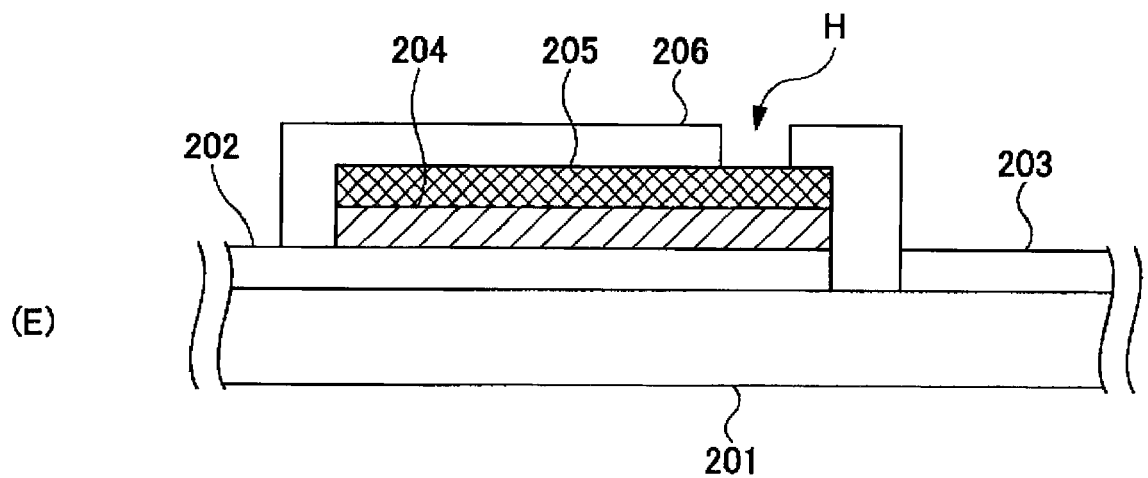

Thereafter, in a process shown in FIG. 3 (D), the organic layer 204 is etched by, for example, a plasma etching while using the patterned negative electrode 205 formed in the process shown in FIG. 2 (C) as a mask, whereby the organic layer 204 is patterned. In this process, an area where a peeling-off of the organic layer 204 is unnecessary (e.g., on the outgoing line 203 or other areas where the light emitting layer is unnecessary) is removed by the etching, and the organic layer 204 is patterned. In the present process, the organic layer 204 is patterned through the etching (e.g., a reactive ion etching (RIE) or an etching employing inductively coupled plasma (ICP)) while the substrate is maintained face-up.

Subsequently, in a process shown in FIG. 3 (E), an insulating protection film 206 made of, e.g., silicon nitride (SiN) is formed on the substrate 201 by a CVD method using a pattern mask in order to cover a part of the positive electrode 202, the organic layer 204 and the negative electrode 205. Further, the protection film 206 has an opening H so that a part of the negative electrode 205 is exposed. In this process, the protection film 206 is formed while the substrate is maintained face-up.

Figure 4:
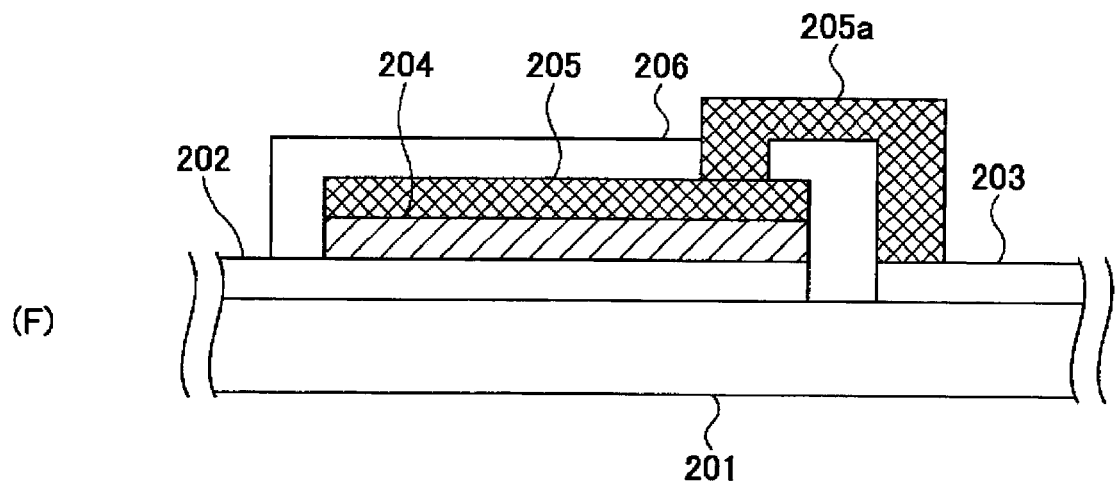
FIG. 4 (F to G) is still another part of the light emitting device manufacturing method in accordance with the first embodiment.
Figure 4:
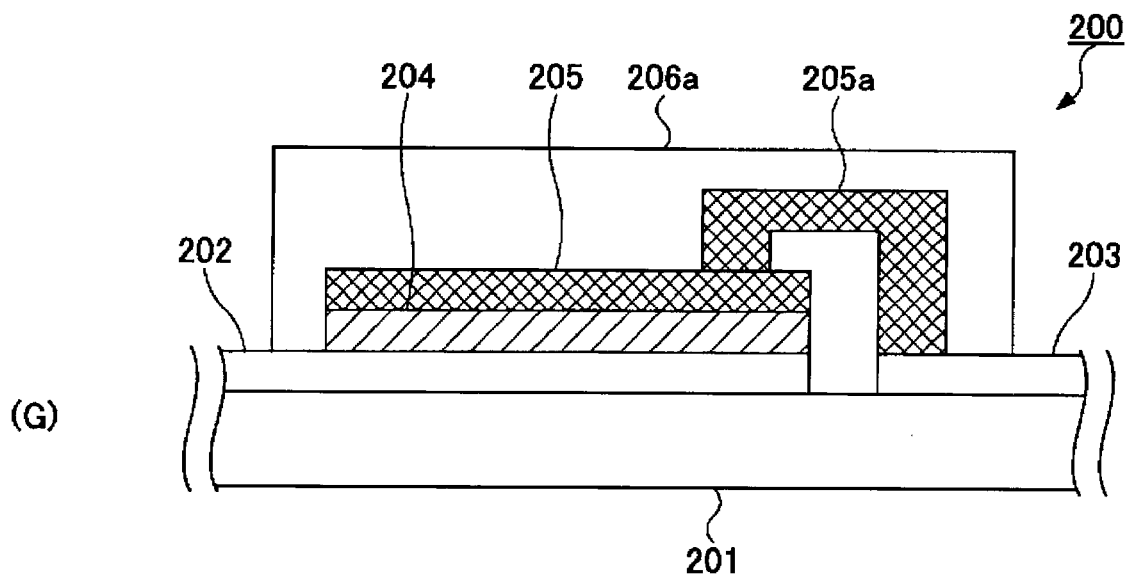

Afterwards, in a process shown in FIG. 4 (F), a connection line 205a electrically connecting the negative electrode 205 with the outgoing line 203 via the opening H is formed by, for example, a sputtering using a pattern mask. In this process, the connection line 205a is formed while the substrate is maintained face-up, as in the process shown in FIG. 2 (C).

Then, in a process shown in FIG. 4 (G), an insulating protection film 206a made of, e.g., silicon nitride (SiN) is formed on the substrate 201 by a CVD method using a pattern mask so as to cover the connection line 205a and a part of the outgoing line 203. In this process, the protection film 206a is formed while the substrate is maintained face-up, as in the process of FIG. 3 (E).

Through the above-described processes, there is obtained a light emitting device 200 having, on the substrate 201, the positive electrode 202, the negative electrode 205 and the organic layer 204 interleaved therebetween. The light emitting device 200 may be called an organic EL device.

In the light emitting device 200, if a voltage is applied between the positive electrode 202 and the negative electrode 205, holes from the positive electrode 202 and electrons from the negative electrode 205 are injected into the light emitting layer contained in the organic layer 204, so that light is emitted therefrom as a result of recombination of the holes and the electrons.

The light emitting layer may be formed by using a material such as polycyclic aromatic hydrocarbon, a heteroaromatic compound, an organic metal complex compound, or the like, and such material can be formed by, for instance, a deposition method.

Moreover, a hole transport layer or a hole injecting layer, for example, may be formed between the light emitting layer and the positive electrode 202 to improve light emission efficiency in the light emitting layer. Further, either one or both of the hole transport layer and the hole injecting layer may be omitted.

Likewise, to ameliorate the light emission efficiency in the light emitting layer, an electron transport layer or an electron injecting layer, for example, may be formed between the light emitting layer and the negative electrode 205. Here, either one or both of the electron transport layer and the electron injecting layer may be omitted.

Further, formed at the interface between the organic layer 204 and the negative electrode 205 may be a layer containing a material for adjusting a work function of the interface (material for improving the light emission efficiency) such as Li, LiF, $CsCO_3$ or the like.

The light emitting layer can be formed by using an aluminoquinolinol complex (Alq3) as a host material and rubrene as a doping material, for example. However, it is not limited thereto, and it can also be formed by using various other materials.

For example, the positive electrode 202, the organic layer 203 and the negative electrode 204 are formed in a thickness ranging from about 100 nm to 200 nm, about 50 nm to 200 nm and about 50 nm to 300 nm, respectively.

Further, the light emitting device 200 can be applied to, for example, a display device (organic EL display device) or a surface luminescent device (light device, light source or the like). However, it is not limited thereto, and it can also be applied to various kinds of electronic devices.

By using the above-described light emitting device manufacturing method in accordance with the present embodiment, it becomes possible to perform a preset process while maintaining the substrate face-up in substantially all of the substrate processing steps performed in the manufacturing apparatus. Further, in the above-described manufacturing apparatus of the light emitting device, since a large-size target substrate need not be maintained face-down, a device for holding the target substrate against the gravity such as an electrostatic holding device (e.g., an electrostatic chuck (ESC)) or the like becomes unnecessary. Moreover, since an apparatus which maintains the substrate face-down and an apparatus which maintains the substrate face-up are not used together in the manufacturing process, an operation of turning the target substrate upside down or the like becomes unnecessary, so that the probability of damage infliction upon the large-size target substrate decreases. Further, since further consideration of the warpage amount of the large-size target substrate is not necessitated, the productivity of the light emitting device using the large-size target substrate enhances.

Furthermore, in the light emitting device manufacturing method in accordance with the present embodiment, since the patterning of the organic layer 204 is carried out by the etching, a conventional mask deposition method need not be used for the film formation of the organic layer. Accordingly, various problems that might be caused by the mask deposition method can be avoided. For example, if a mask is used, the mask may be deformed due to a temperature rise of the mask during the deposition, which may result in deterioration of patterning accuracy of the deposited film (organic layer 204). Since, however, no mask is used in the light emitting device manufacturing method of the present embodiment, such problem can be avoided. Further, no use of the mask can also prevent particle generation, which might be caused when using the mask. Therefore, a high-quality light emitting device can be manufactured, achieving high yield as well.

Furthermore, since the organic layer 204 is etched by using the negative electrode 205 as a mask, the organic layer 204 between the neighboring negative electrodes 205 is removed. However, since light emission for display takes place in a region interleaved between the negative electrode 205 and the positive electrode 202, no display problem occurs and the display quality thereof is as good as that of a conventional display device. That is, the etching using the negative electrode 205 as the mask is a simple and desirable manufacturing method capable of securely attaining (masking) and protecting the organic layer (light emitting layer) for display (light emission). As in the above description, a processing chamber for the etching of this organic layer is also configured so as to allow the processing to be performed while the substrate is maintained face-up (this will be described later in FIG. 8).

The manufacturing apparatus for performing the above-described light emitting device manufacturing method includes, for example, processing chambers (e.g., film forming chambers) respectively corresponding to the processes described in FIG. 2 (A to C), FIG. 3 (D to E) and FIG. 4 (F to G). Below, configurations of these processing chambers will be explained.

Figure 5:
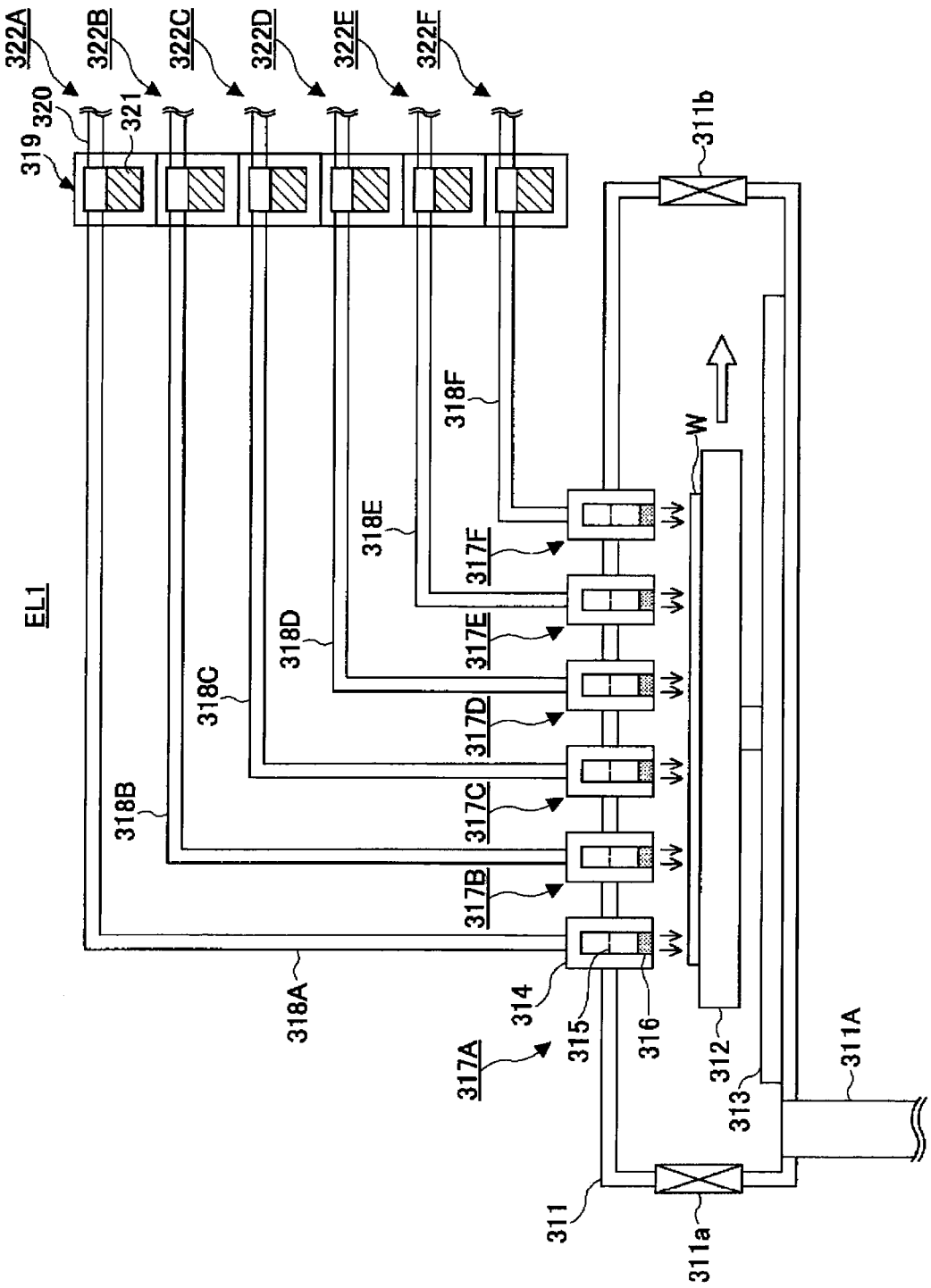
FIG. 5 illustrates an example of a light emitting device manufacturing apparatus in accordance with the first embodiment.

FIG. 5 provides a schematic diagram showing a processing chamber (film forming chamber) EL1 of the light emitting device manufacturing apparatus in accordance with the embodiment of the present invention. The processing chamber EL1 is a processing chamber (film forming chamber) for performing the film forming process of the organic layer shown in FIG. 2 (B) by the deposition.

Referring to FIG. 5, the film forming chamber EL1 includes a processing vessel 311 having therein a holding table 312 for holding thereon a target substrate W (corresponding to the substrate 201 in FIG. 2 (A)). The inside of the processing vessel 311 is evacuated by a vacuum pump (not shown) via a gas exhaust line 311A and maintained in a depressurized state.

Disposed outside the processing vessel 311 is a film forming source gas generation unit 322A for generating a film forming source material in a gaseous state (gaseous source material) by, for example, evaporating or sublimating a liquid or solid deposition source material 321.

The film forming source gas generation unit 322A includes a source material container 319 and a carrier gas supply line 320. The film forming source material 321 accommodated in the source material container 319 is heated by a non-illustrated heater or the like, so that the gaseous film forming source material (film forming source gas) is generated. The generated film forming source gas is delivered to a film forming source gas supply unit 317A installed at the processing vessel 311 via a supplying path 318A along with a carrier gas supplied from the carrier gas supply line 320. Thereafter, the film forming source gas is supplied into a region above the target substrate W inside the processing vessel 311 from the film forming source gas supply unit 317A and decomposed in the vicinity of and/or above the target substrate W, so that a film is formed on the target substrate W.

That is, in the above-described configuration, the face-up film formation of the organic layer 304 is possible. For example, when performing the film formation in a conventional light emitting device manufacturing apparatus by using, for instance, a deposition method, such film forming process needs to be performed by a so-called face-down film forming process in which the film forming surface of the target substrate is maintained downward to allow the source material evaporated or sublimated from the deposition source inside the processing chamber to be adhered onto the target substrate. Accordingly, in case that the target substrate has a large size, handling of the target substrate becomes difficult, resulting in deterioration of productivity of the light emitting device.

Meanwhile, since the above-stated processing chamber is configured such that the face-up film formation is enabled therein, handling of the large-size target substrate is facilitated. Therefore, the productivity of manufacturing the light emitting device improves, while reducing manufacturing cost.

The film forming source gas supply unit 317A includes a supply unit main body 314 of, e.g., a cylindrical shape or a housing shape connected with the supplying path 318A. One end of the supply unit main body 314 is opened toward the target substrate W, and a filter plate 316 made of, e.g., a porous metal material (metal filter) is installed at the one end. Further, inside the supply unit main body 314, there is installed a flow adjusting plate 315 for controlling the flow of the film forming source gas.

Further, also arranged in a line at the processing vessel 311 together with the film forming source gas supply unit 317A are film forming source gas supply units 317B to 317F each having similar structure to that of the film forming source gas supply unit 317A. Furthermore, the film forming source gas supply units 317B to 317F are connected with film forming source gas generation units 322B to 322F via supplying paths 318B to 318F, respectively. Each of the film forming source gas generation units 322B to 322F have the similar structure to that of the film forming source gas generation unit 322A.

Further, a moving rail 313 is installed on the bottom surface of the processing vessel 311, and the holding table 312 is configured to be movable along the moving rail. If the holding table 312 moves along a direction indicated by an arrow in FIG. 5, the target substrate W loaded on the holding table 312 passes under the film forming source gas supply units 317A to 317F in their arrangement order.

In this case, different film forming source gases are supplied from the film forming source gas supply units 317A to 317F, and as the holding table 312 is moved, a face-up formation of an organic layer consisting of a multi-layered structure is carried out on the target substrate W.

Further, gate valves 311a and 311b are also installed at the processing vessel 311, and transfer chambers to be described later are connected with the processing vessel 311 via these gate valves. Through opening the gate valve 311a or 311b, loading/unloading of the target substrate W into/from the processing vessel 311 is enabled.

For example, in a conventional light emitting device manufacturing apparatus having a cluster structure, the organic layer consisting of the multi-layered structure is formed by using a plurality of face-down film forming processing chambers. Accordingly, a large number of processing chambers is required for the formation of the organic layer. Furthermore, the manufacturing apparatus gets scaled-up and complicated, and the transfer of the large-size target substrate becomes difficult. Meanwhile, in the present embodiment, it is possible to perform the face-up film formation of the organic layer having the multi-layered structure successively in a single processing chamber. Accordingly, the structure of the manufacturing apparatus can be simplified, and size reduction thereof can also be achieved easily.

Figure 6:
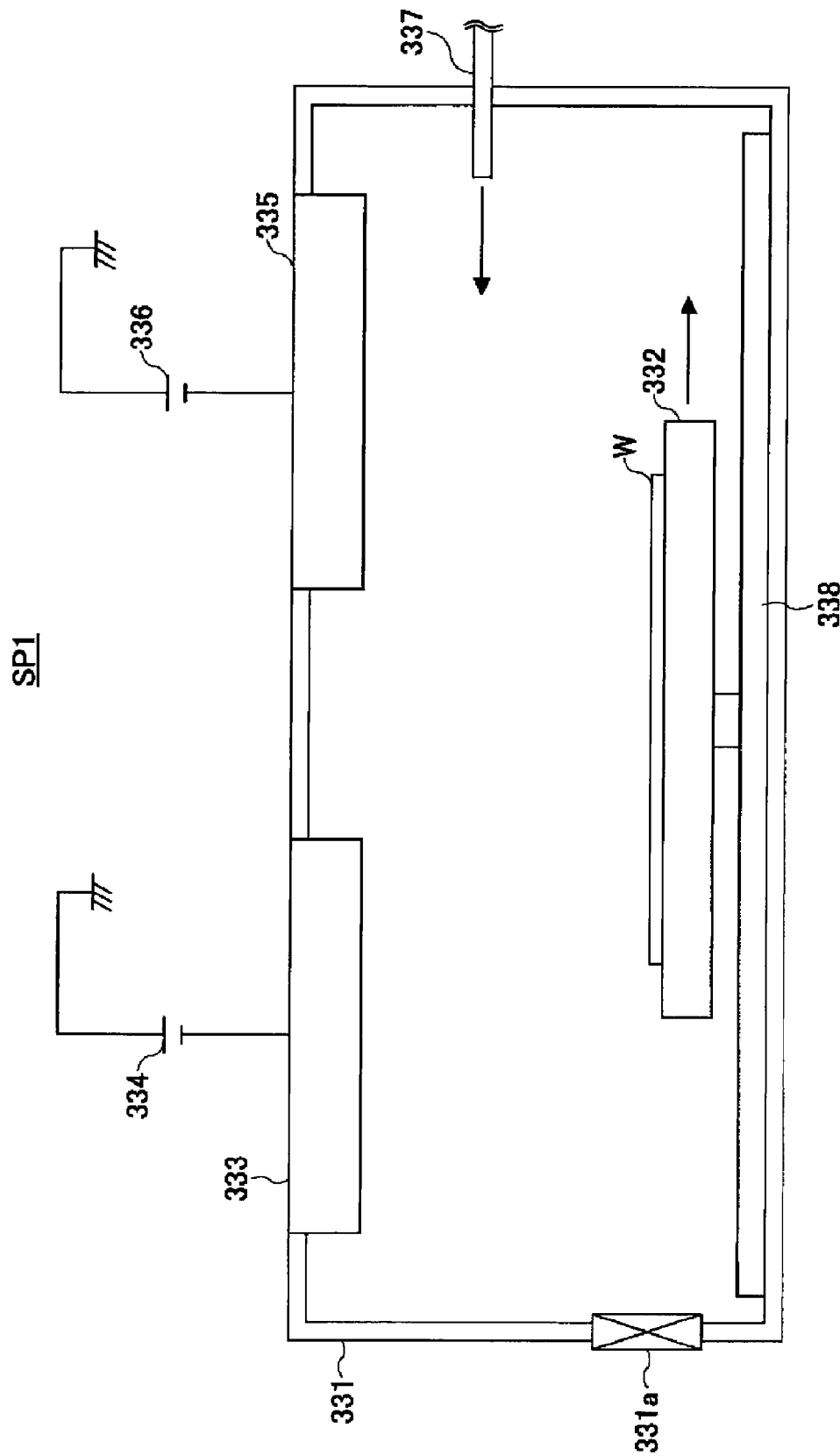
FIG. 6 is another example of the light emitting device manufacturing apparatus in accordance with the first embodiment.

Further, FIG. 6 presents a schematic diagram of a processing chamber (film forming chamber) SP1 of the light emitting device manufacturing apparatus. The processing chamber SP1 is a processing chamber (film forming chamber) for performing the film formation process of the negative electrode as shown in FIG. 2 (C) by the sputtering.

Referring to FIG. 6, the film forming chamber SP1 includes a processing vessel 331 having therein a holding table 332 for holding thereon the target substrate W. The processing vessel 331 is evacuated by a gas exhaust line (not shown) connected with a vacuum pump and is maintained in a depressurized state. The holding table 332 is configured to be movable in parallel on a moving rail 338 installed on the bottom surface of the processing vessel 331.

Further, targets 333 and 335 are disposed in the processing vessel 331 to face the holding table 332. The targets 333 and 335 are connected with power supplies 334 and 336, respectively. Further, a gas supply unit 337 for supplying a sputtering gas such as Ar or the like is installed at a lateral side of the processing vessel 331.

Further, a gate valve 331a is installed at the processing vessel 331, and a transfer chamber (to be described later) is connected with the processing vessel 331 via the gate valve 331a. Through opening the gate valve 331a, the target substrate W can be loaded into the processing vessel 331 or unloaded from the processing vessel 331.

In the above-described processing chamber, by selecting different kinds of targets 333 and 335, for example, film formation of various kinds of materials can be achieved. For example, after forming the organic layer, by moving the holding table 332 holding thereon the target substrate W along a direction indicated by an arrow of FIG. 6 while using a silver (Ag) target as the target 333 and an aluminum (Al) target as the target 335, an Ag layer is first formed on the organic layer and then an Al layer is formed on the Ag layer. That is, a negative electrode having two layers of Ag layer and Al layer can be successively formed in the single processing chamber. Further, in the above-described processing chamber, the film formation of the negative electrode is also performed by a face-up film formation process.

Further, it may also be possible to form another layer for improving light emission efficiency between the organic layer and the negative electrode by using the above-described processing chamber. For example, in the light emitting device using the organic layer and the metal electrode, the light emission efficiency may be deteriorated due to the difference of work functions between the organic layer and the electrode. To suppress the deterioration of the light emission efficiency, a layer containing a certain metal (e.g., a metal layer, a metal compound layer, or the like) can be formed between the organic layer and the electrode (that is, on the organic layer).

Here, a layer made of, for example, Li, LiF, $CsCO_3$, or the like can be used as the layer for suppressing the deterioration of the light emission efficiency (i.e., work function adjusting layer).

Moreover, when manufacturing a light emitting device of, e.g., a bottom emission type, a material having a good light emission reflectivity is desirably used as a material for constituting the negative electrode formed in a top layer (top cathode), and desirably, such material can be Ag, for example. Further, when Ag is used as the negative electrode, it is desirable to use a Li layer as the work function adjusting layer.

Furthermore, for example, in the film formation by using the sputtering method, it may also be possible to install the two targets in parallel, thereby suppressing damage infliction on a film formation target object (e.g., the organic layer).

Figure 7:
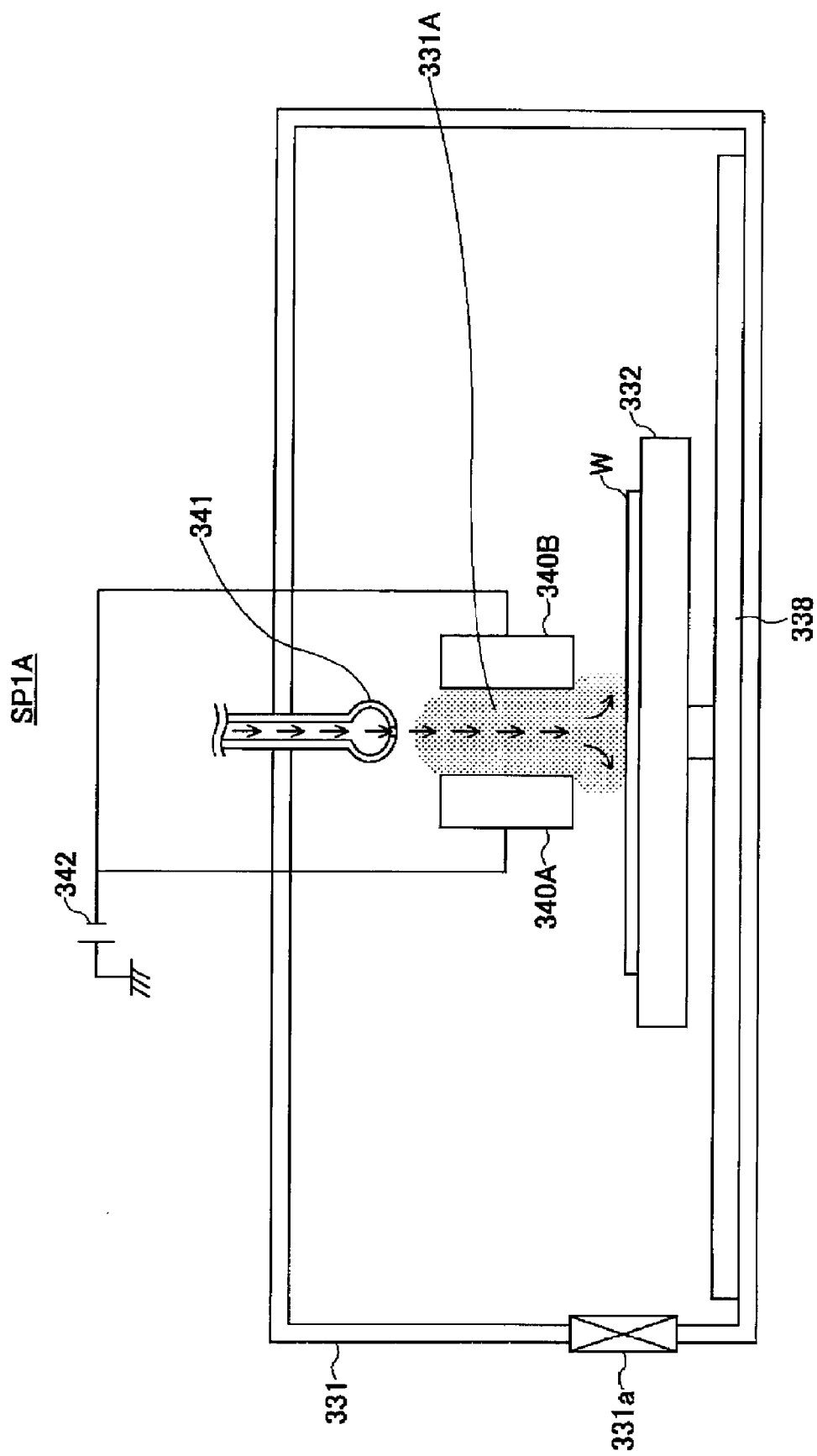
FIG. 7 is still another example of the light emitting device manufacturing apparatus in accordance with the first embodiment.

FIG. 7 depicts a schematic diagram showing a configuration of a processing chamber SP1A which is a modification of the processing chamber SP1 described above. In this figure, parts identical with those described above will be assigned like reference numerals, and redundant description thereof will be omitted. Referring to FIG. 7, targets 340A and 340B to which a voltage is applied independently are installed to face each other in a processing vessel 331 of the processing chamber SP1A.

The two targets 340A and 340B installed above a substrate holding table 332 are configured to face each other and are extended along a direction approximately perpendicular to the direction along which the substrate holding table 332 moves.

Further, also installed inside the processing vessel 331 is a gas supply unit 341 for supplying a processing gas for sputtering, such as Ar or the like, to a space 331A between the targets 340A and 340B. As the voltage is applied from a power supply 342, the processing gas is excited into plasma.

In the processing chamber SP1A, by applying the power to each of the targets 340A and 340B from the power supply 342, the plasma is excited in the space 331A, so that the targets are sputtered, and the film formation on the target substrate W is carried out.

In the processing chamber SP1A, the target substrate W is distanced away from the space (space 331A) in which the plasma is excited, and the film formation target object is unlikely to suffer damage due to collision of sputtered particles or infrared rays accompanied by the plasma excitation. Therefore, if the above-described processing chamber SP1A is used, it is possible to form the negative electrode (Ag, Al) or the work function adjusting layer (Li or the like) while suppressing damage inflicted on the organic layer which is the film formation target object.

Figure 8:
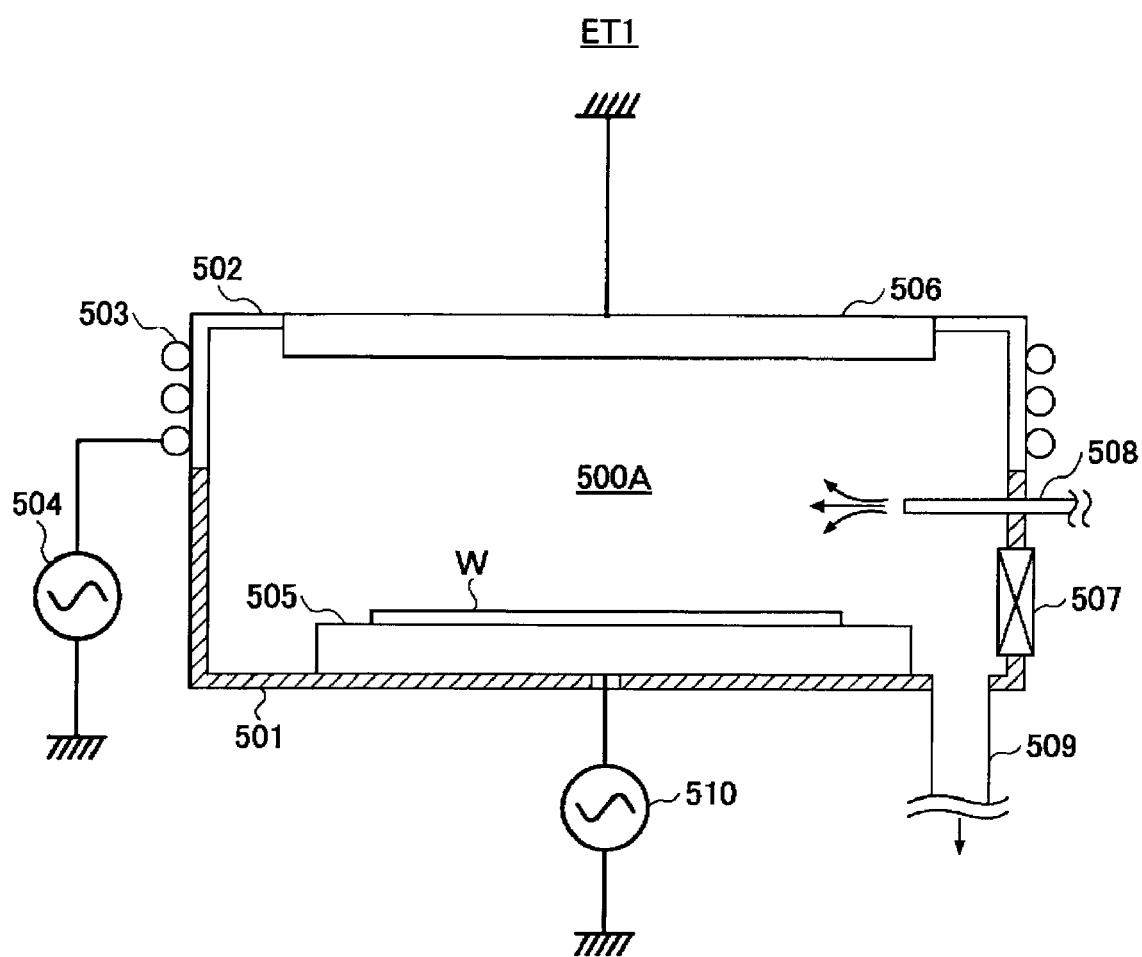
FIG. 8 is still another example of the light emitting device manufacturing apparatus in accordance with the first embodiment.

Further, FIG. 8 provides a schematic diagram of a processing chamber (etching chamber) ET1 of the light emitting device manufacturing apparatus. The processing chamber ET1 is a processing chamber for performing a patterning process of the organic layer shown in FIG. 3 (D) by the etching.

Referring to FIG. 8, the processing chamber ET1 includes processing vessels 501 and 502, and by combining them, an inner space 500A is defined inside. An earth plate 506 and a substrate holding table 505 are installed to face each other in the inner space 500A. The inner space 500A is evacuated by a gas exhaust line 509 connected with a gas exhaust unit (not shown) such as a gas exhaust pump and depressurized to a preset pressure level and maintained thereat.

Further, the processing vessel 501 is made of, for example, a metal, and the processing vessel 502 is made of a dielectric material. Installed outside the processing vessel 502 is a coil 503 to which a high frequency power is applied from a high frequency power supply 504. Further, a high frequency power from a high frequency power supply 510 is applied to the substrate holding table 505.

A processing gas for etching, e.g., $N_2$/Ar, is supplied into the inner space 500A from the gas supply unit 508. As the high frequency power is applied to the coil 503, the processing gas is excited into plasma. This plasma may be referred to as high-density plasma (e.g., ICP). By using the processing gas dissociated by the high-density plasma, the process shown in FIG. 3 (D) (for etching the organic layer 204 by using the negative electrode 205 as a mask) can be carried out.

Further, in the processing vessel 501, a gate valve 507 is installed on the side connected with a transfer chamber (to be described later). Through opening the gate valve 507, loading/unloading of the target substrate W into/from the processing vessel 501 can be performed.

In the above-described processing chamber, the organic layer 204 can be patterned by a face-up etching.

For example, in case that the negative electrode 205 contains Ag, it is desirable to use, for example, nitrogen ($N_2$) as the processing gas. For instance, the nitrogen is less likely to corrode metal such as Ag in comparison with the oxygen or hydrogen and is capable of etching the organic layer 204 efficiently.

Further, though it is desirable to use the so-called high-density plasma as the plasma of the etching apparatus for dissociating the processing gas, the high-density plasma is not limited to the ICP, but similar result can be obtained by using, for example, microwave plasma or the like.

In addition, the organic layer can be patterned by an etching using, for example, parallel plate type plasma (e.g., RIE or the like).

Figure 9:
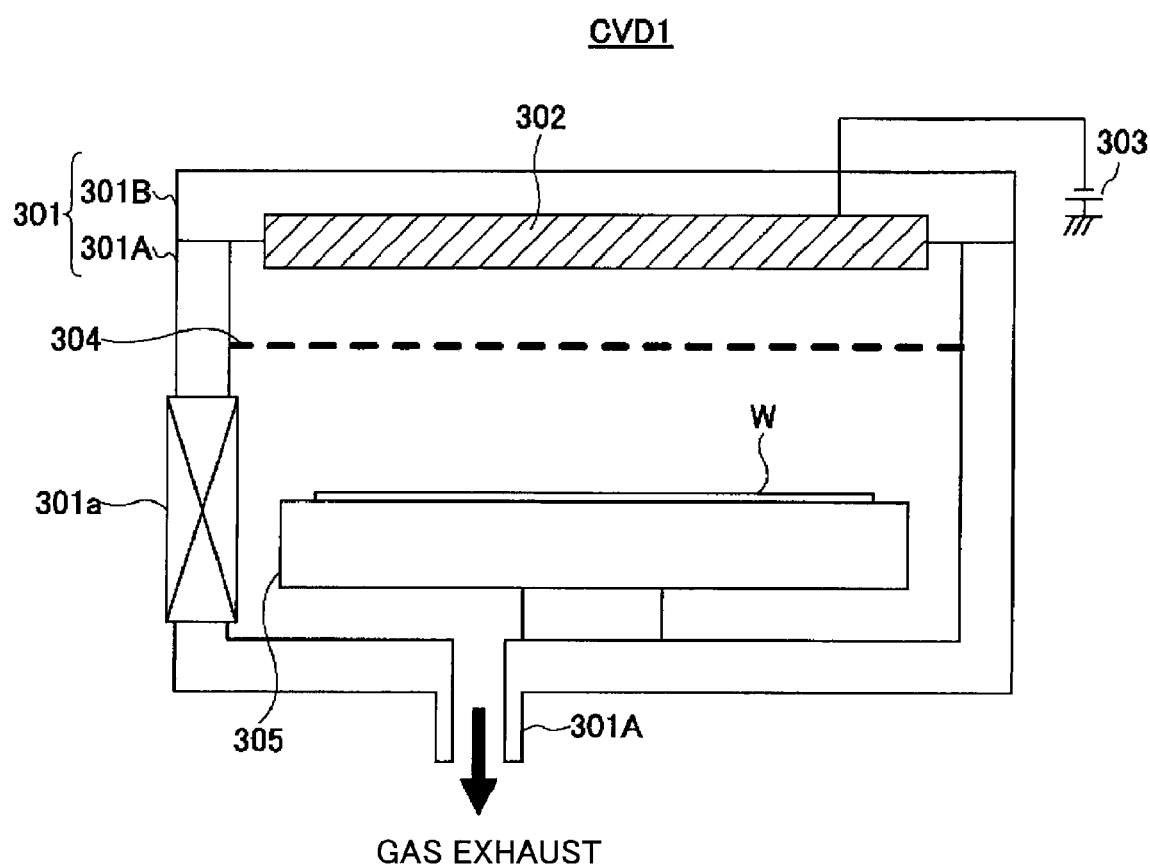
FIG. 9 illustrates still another example of the light emitting device manufacturing apparatus in accordance with the first embodiment.

Further, FIG. 9 is a schematic diagram of a processing chamber (CVD film forming chamber) CVD1 of the light emitting device manufacturing apparatus. The processing chamber CVD1 is a processing chamber for performing a film formation of the protection film as shown in FIG. 3 (E). Further, it may also be possible to perform the process shown in FIG. 4 (G) by using the processing chamber CVD1.

Referring to FIG. 9, the processing chamber CVD1 includes a processing vessel 301 having therein a holding table 305 for holding thereon the target substrate W. The inside of the processing vessel 301 is evacuated by a gas exhaust line 301A connected with a vacuum pump (not shown) and is maintained in a depressurized state. The processing vessel 301 includes a lid 301B installed at an opening in one end of a lower vessel 301A having, for example, an approximately cylindrical shape. Installed at the lid 301B is, for example, an approximately circular plate shaped antenna 302, and microwave is applied to the antenna 302 from a power supply 303.

Furthermore, a gas supply unit 304 for supplying a film forming source gas into the processing vessel is installed between the antenna 302 and the holding table 305. The gas supply unit 304 is formed in, for example, a lattice shape, and the microwave is transmitted through openings of the lattice structure.

Accordingly, the film forming source gas supplied from the gas supply unit 304 is excited into plasma by the microwave supplied from the antenna 302, so that the protection film (SiN layer) is formed on the target substrate W held on the holding table 305.

In addition, in the processing chamber 301, a gate valve 301a is installed at one side connected with a transfer chamber (to be described later). Through opening the gate valve 301a, loading/unloading of the target substrate W into/from the processing vessel 301 can be performed.

In the above-described processing chamber, the formation of the protection films 206 and 206a can be carried out by a face-up film formation.

Now, an example layout of the light emitting device manufacturing apparatus including the above-stated processing chambers EL1, SP1, ET1 and CVD1 will be described.

Figure 10:
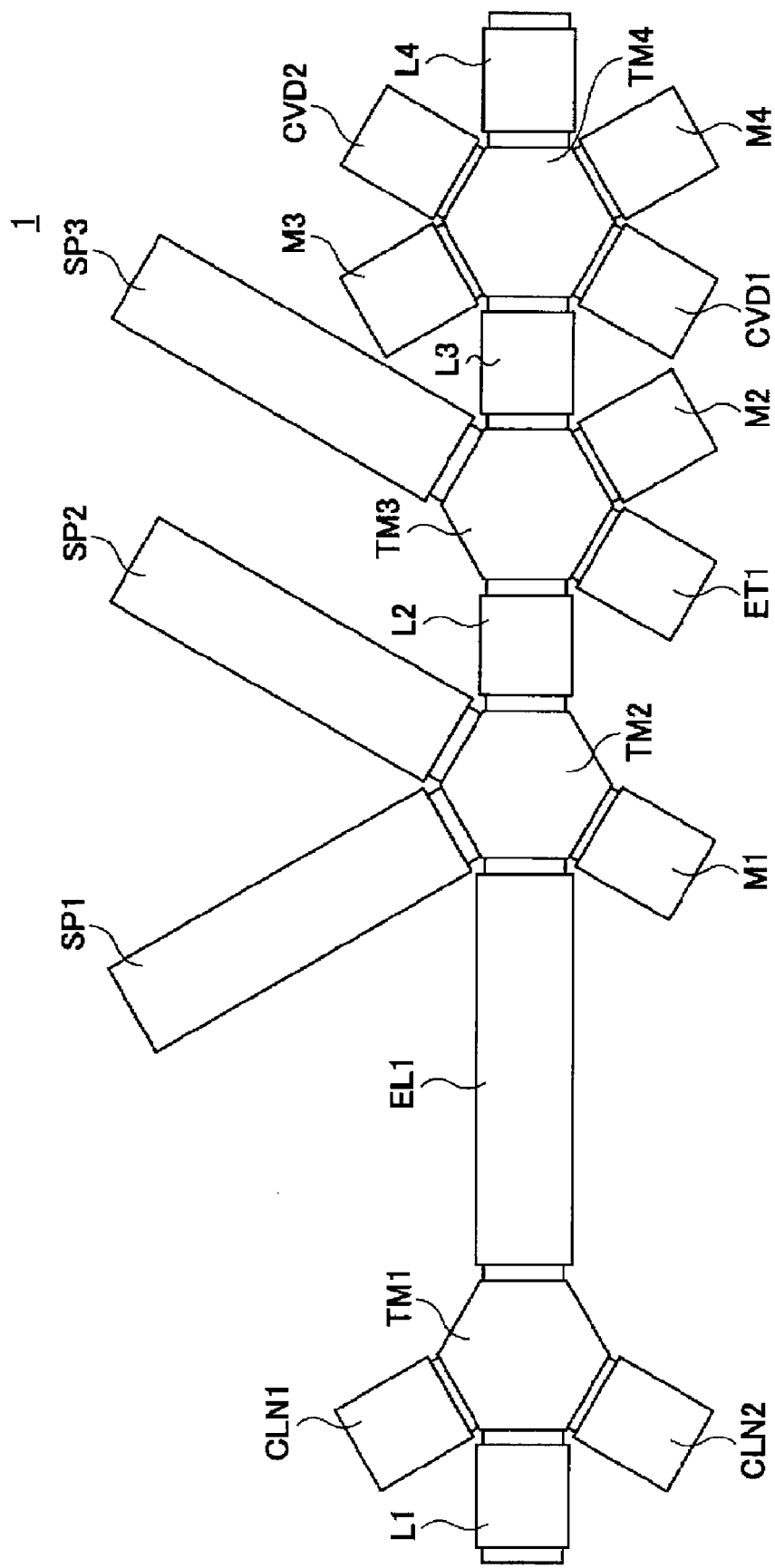
FIG. 10 is a layout of the light emitting device manufacturing apparatus in accordance with the first embodiment.

FIG. 10 is a schematic diagram showing the layout of the light emitting device manufacturing apparatus 1 in accordance with the first embodiment of the present invention. Here, parts identical to those described above will be assigned like reference numerals, while omitting redundant description thereof. Referring to FIG. 10, the light emitting device manufacturing apparatus 1 in accordance with the present embodiment includes a multiplicity of transfer chambers TM1, TM2, TM3 and TM4 connected with the plurality of processing chambers.

Each of the transfer chambers TM1, TM2, TM3 and TM4 are connected with a vacuum pump (not shown) for maintaining their interior spaces in a depressurized state, and have therein a target substrate transfer mechanism (not shown) such as a transfer arm. Accordingly, the target substrate can be transferred under the depressurized state. In such case, the target substrate is transferred while it is maintained face-up.

Further, the transfer chambers TM1, TM2, TM3 and TM4 are arranged in a straight line, for example, and the plurality of processing chambers for processing the target substrate is connected with these transfer chambers, respectively. Besides, each of the transfer chambers TM1, TM2, TM3 and TM4 have a hexagonal shape when viewed from above, and the processing chambers are connected to each side (connection interface) of the hexagon.

Specifically, connected with the transfer chamber TM1 are a load lock chamber L1 into which the target substrate is transferred; and cleaning processing chambers CLN1 and CLN2 for performing a surface processing (cleaning or the like) of the target substrate. Further, the processing chamber EL1 for forming the organic layer described earlier in FIG. 5 is also connected to the transfer chamber TM1.

Further, an end portion of the processing chamber EL1 opposite to an end portion connected with the transfer chamber TM1 is connected with one connection interface of the transfer chamber TM2. Other connection interfaces of the transfer chamber TM2 are connected with the processing chamber SP1 described above in FIG. 6; a processing chamber SP2 having a similar structure to that of the processing chamber SP1; a mask processing chamber M1 for performing attachment/detachment of a mask to/from the target substrate; and a load lock chamber L2.

Further, an end portion of the load lock chamber L2 opposite to an end portion connected with the transfer chamber TM2 is connected with one connection interface of the transfer chamber TM3. Other connection interfaces of the transfer chamber TM3 are connected with a processing chamber SP3 having a similar structure to that of the processing chambers SP1 or SP2; the processing chamber ET1 described above in FIG. 8; a mask processing chamber M2 having a similar structure to that of the mask processing chamber M1; and a load lock chamber L3 having a similar structure to that of the load lock chamber L2.

Furthermore, an end portion of the load lock chamber L3 opposite to an end portion connected with the transfer chamber TM3 is connected with one connection interface of the transfer chamber TM4. Other connection interfaces of the transfer chamber TM4 are connected with mask processing chambers M3 and M4 having similar structure to that of the mask processing chamber M2; the processing chamber CVD1 described above in FIG. 9; a processing chamber CVD2 having a similar structure to that of the processing chamber CVD1; and a load lock chamber L4 having a similar structure to that of the load lock chamber L1.

In the above-described light emitting device manufacturing apparatus, the target substrate W (the substrate 201 shown in FIG. 2 (A)) is transferred from the load lock chamber L1. Here, the target substrate W is transferred between the plurality of processing chambers by the non-illustrated transfer mechanisms (transfer arms or the like) of the transfer chambers TM1 to TM4, and the target substrate is processed in the plurality of processing chambers. Here, the processes illustrated in FIGS. 2 (B) to 4 (G) are performed, so that the light emitting device is formed on the device formation surface of the target substrate. The target substrate on which the light emitting device is formed is unloaded from the load lock chamber L4 to the outside of the manufacturing apparatus.

In this case, the process shown in FIG. 2 (B) is performed in the processing chamber EL1; the process shown in FIG. 2 (C) is performed in any one of the processing chambers SP1 to SP3; the processing shown in FIG. 3 (D) is performed in the processing chamber ET1; the process shown in FIG. 3 (E) is performed in any one of the processing chambers CVD1 and CVD2; the process shown in FIG. 4 (F) is performed in any one of the processing chambers SP1 to SP3; and the process shown in FIG. 4 (G) is performed in any one of the processing chambers CVD1 and CVD2.

Besides, it may also be possible to perform a cleaning process in any one of the processing chambers CLN1 and CLN2 prior to the process shown in FIG. 2 (B), if necessary. Further, before and after the above-stated processes, attachment/detachment of masks to/from the target substrate can be performed in the mask processing chambers M1 to M4, if required.

Since all the processing chambers of the above-described light emitting device manufacturing apparatus 1 are configured to be capable of performing various processes while maintaining the target substrate face-up, it can handle a large-size substrate easily. Further, in the light emitting device manufacturing apparatus in accordance with the present embodiment, the direction of the target substrate is identical as being oriented face-up in all of the processing chambers and the transfer chambers, and thus transferring or setting of the target substrate is facilitated.

Thus, the structure of the light emitting device manufacturing apparatus can be simplified, and the productivity of the light emitting device is enhanced. As a result, manufacturing cost can be reduced.

Furthermore, since damage of the target substrate is suppressed and management of the warpage amount of the target substrate is eased, productivity further improves.

Especially, there is a recent trend for scale-up of a flat panel display, and the size of a display device using the light emitting device (organic EL device) tends to increase. Accordingly, the size of the target substrate on which the light emitting device is formed also tends to be increased. In keeping up with such size-up trend of the target substrate, the light emitting device manufacturing apparatus in accordance with the present embodiment is advantageous in that it has high reliability and manipulability in transferring or setting of the large-size target substrate.

Second Embodiment

Further, the light emitting device manufacturing apparatus in accordance with the present invention is not limited to the above-described configuration, but can be changed and modified in various ways.

Figure 11:
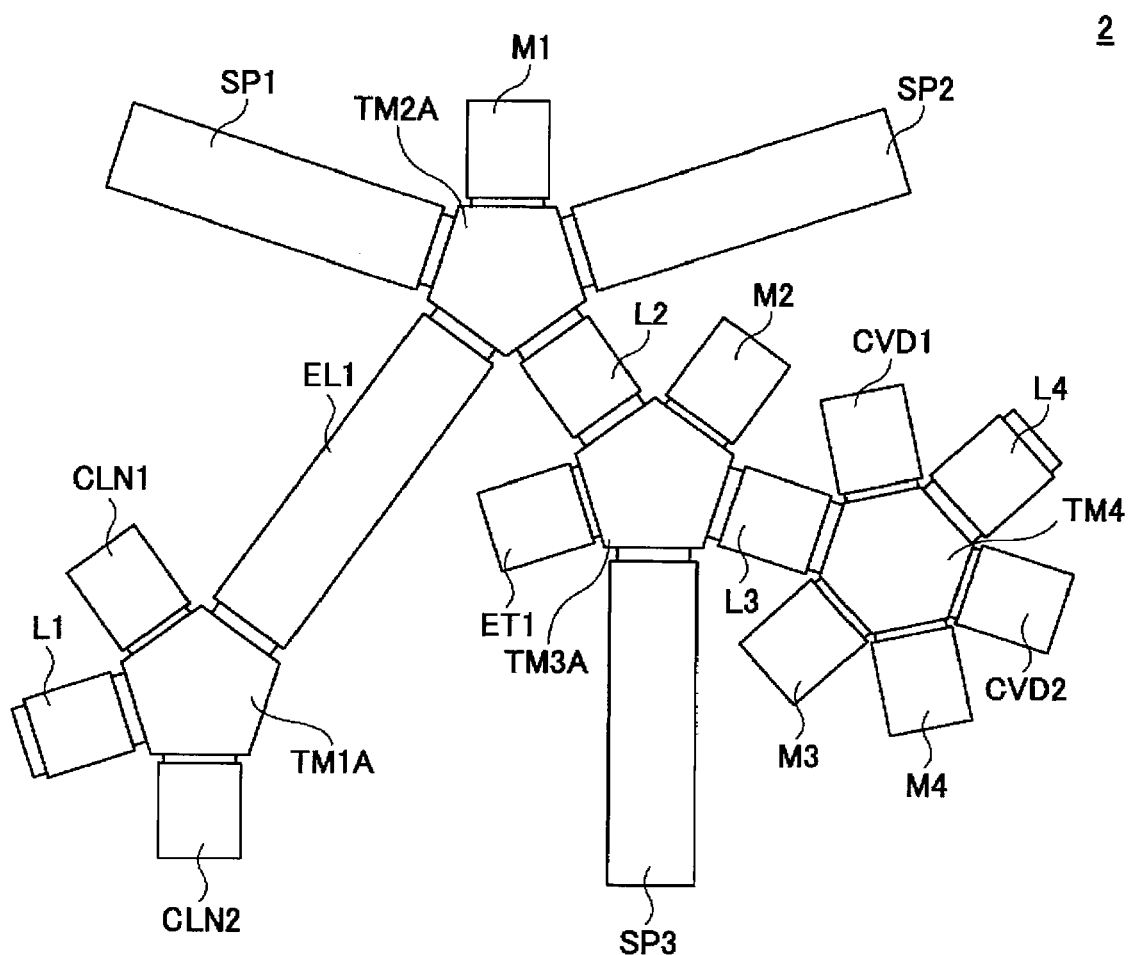
FIG. 11 is another layout of a light emitting device manufacturing apparatus in accordance with a second embodiment.

FIG. 11 sets forth a schematic diagram showing a layout of a light emitting device manufacturing apparatus 2 in accordance with a second embodiment of the present invention. Here, parts identical with those described above will be assigned like reference numerals, and description thereof will be omitted. Referring to FIG. 11, in the light emitting device manufacturing apparatus 2 in accordance with the present embodiment, a transfer chamber TM1A corresponding to the transfer chamber TM1 in the first embodiment has a pentagonal shape when viewed from above. Further, as in the case of the transfer chamber TM1, the load lock chamber L1, the cleaning processing chambers CLN1 and CLN2 and the processing chamber EL1 are connected to the transfer chamber TM1A.

Further, transfer chambers TM2A and TM3A corresponding to the transfer chambers TM2 and TM3 of the first embodiment also have pentagonal shapes when viewed from above. Further, processing chambers connected to these transfer chambers are the same as those in case of the first embodiment. That is, the processing chambers EL1, SP1 and SP2, the mask processing chamber M1 and the load lock chamber L2 are connected to the transfer chamber TM2A. Furthermore, the processing chambers ET1 and SP3, the mask processing chamber M2, the load lock chambers L2 and L3 are connected to the transfer chamber TM3A.

With the light emitting device manufacturing apparatus 2 in accordance with the present embodiment, it is possible to carry out the manufacture of the light emitting device as in the light emitting device manufacturing apparatus 1 of the first embodiment, while obtaining similar effects as those attained in the first embodiment. In the present embodiment, since the plural transfer chambers TM1A, TM2A, TM3A and TM4 have different shapes, they are not arranged in a straight line. As such, the plurality of transfer chambers may not be arranged in the straight line, but the light emitting device manufacturing apparatus can be configured by various arrangements.

Third Embodiment

Figure 12:
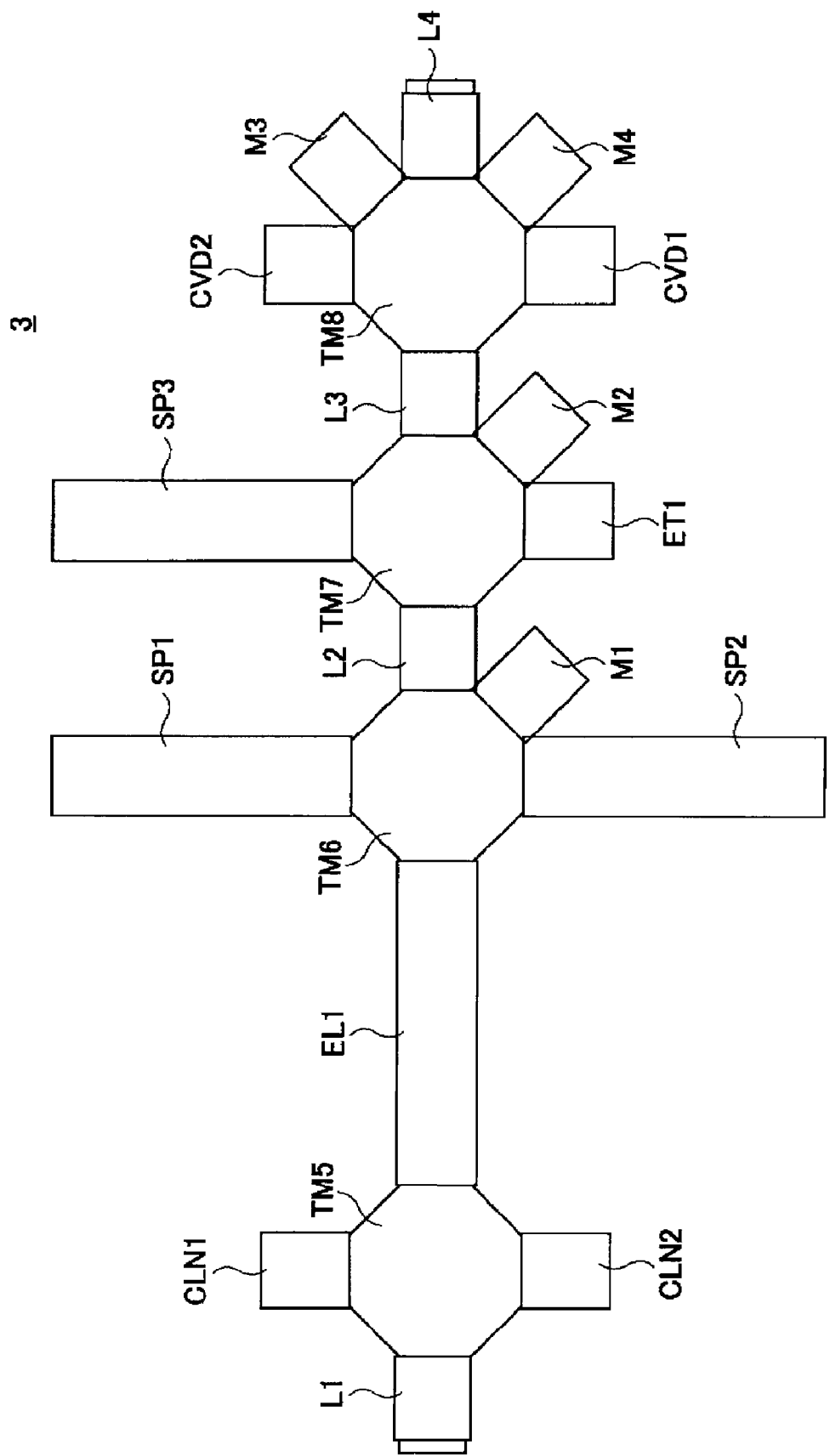
FIG. 12 is still another layout of a light emitting device manufacturing apparatus in accordance with a third embodiment.

FIG. 12 presents a schematic diagram showing a layout of a light emitting device manufacturing apparatus 3 in accordance with a third embodiment of the present invention. Here, parts identical with those described above will be assigned like reference numerals, while omitting redundant description thereof. Referring to FIG. 12, in the light emitting device manufacturing apparatus 3 in accordance with the present embodiment, transfer chambers TM5, TM6, TM7 and TM8 corresponding to the transfer chambers TM1, TM2, TM3 and TM4, respectively, have octagonal shapes when viewed from above. Processing chambers connected to the respective transfer chambers TM5 to TM8 are the same as those in case of the transfer chambers TM 1 to TM4 of the first embodiment.

The load lock chamber L1, the cleaning processing chambers CLN1 and CLN2 and the processing chamber EL1 are connected to the transfer chamber TM5. The processing chambers EL1, SP1 and SP2, the mask processing chamber M1 and the load lock chamber L2 are connected to the transfer chamber TM6. The processing chambers ET1 and SP3, the mask processing chamber M2, the load lock chambers L2 and L3 are connected to the transfer chamber TM7. Further, the processing chambers CVD1 and CVD2, the mask processing chambers M3 and M4 and the load lock chambers L3 and L4 are connected to the transfer chamber TM8.

With the light emitting device manufacturing apparatus 3 in accordance with the present embodiment, it is still possible to carry out the manufacture of the light emitting device as in the light emitting device manufacturing apparatus 1 of the first embodiment, while obtaining similar effects as attained in the first embodiment.

As described above, the shapes of the transfer chambers or the positions of the processing chambers connected to the connection interfaces of the transfer chambers can be changed or modified in various ways. Further, the number of the connected processing chambers can be varied appropriately in consideration of productivity and cost of the manufacturing apparatus.

So far, though the present invention has been described with respect to the preferable embodiments, it is not limited to the above-described specific embodiments, but various changes and modifications may be made without departing from the meaning and scope of the claims.

INDUSTRIAL APPLICABILITY

In accordance with the present invention, it is possible to provide an apparatus and a method for manufacturing a light emitting device, capable of manufacturing a light emitting device having multiple layers including an organic layer with high productivity.

The present international application claims the benefit of Japanese Patent Application Ser. No. 2006-164965, filed on Jun. 14, 2006, of which specification, claims and drawings are hereby incorporated by reference in its entirety.

What is claimed is:

1. A light emitting device manufacturing method for forming, on a device forming surface of a target substrate, a light emitting device having multiple layers including an organic layer, the method comprising:
a plurality of substrate processing steps respectively performed in a plurality of processing chambers,
wherein, in the plurality of processing chambers, a process is performed on the target substrate while the device forming surface is oriented toward a direction opposite to a direction of gravity,
wherein, in one of the plurality of processing chambers, a plurality of film forming source gases are simultaneously supplied to the device forming surface of the target substrate so as to form the multiple layers of the light emitting device.

2. The manufacturing method of claim 1, wherein, in a transfer chamber connected with the plurality of processing chambers and transferring the target substrate to the plurality of processing chambers, the target substrate is transferred while maintaining the device forming surface to be oriented toward the direction opposite to the direction of gravity.

3. The manufacturing method of claim 2, wherein the target substrate is transferred into the plurality of processing chambers via a multiplicity of the transfer chambers.

4. The manufacturing method of claim 1, wherein the plurality of substrate processing steps includes:
an organic layer forming step for forming the organic layer; and
an electrode forming step for forming an electrode for applying a voltage to the organic layer.

5. The manufacturing method of claim 4, wherein, in the organic layer forming step, the organic layer having a multi-layered structure including a light emitting layer, which emits light as the voltage is applied thereto, is successively formed by a deposition method.

6. The manufacturing method of claim 5, wherein, in the organic layer forming step, a film formation of the organic layer is carried out in a film forming processing chamber including:
a holding table for holding thereon the target substrate; and
a plurality of film forming source gas supply units for supplying a multiplicity of film forming source gases for a deposition onto the target substrate.

7. The manufacturing method of claim 6, wherein the film forming source gas(es) is supplied to the plurality of film forming source gas supply units via a supplying path(s) for supplying the film forming source gas(es) from a film forming source gas generation unit(s) for generating the film forming source gas(es) by evaporating or sublimating a deposition source material(s).

8. The manufacturing method of claim 7, wherein the multiplicity of film forming source gases are respectively supplied to a plurality of film forming source gas supply units from a corresponding plurality of the film forming source gas generation units via a plurality of the supplying paths.

9. The manufacturing method of claim 8, wherein the holding table moves along an arrangement direction of the plurality of film forming source gas supply units.

10. The manufacturing method of claim 4, wherein, in the electrode forming step, the electrode is formed by a sputtering method using two targets facing each other.

11. The manufacturing method of claim 1, wherein the plurality of substrate processing steps includes an etching step for etching and patterning the organic layer.

* * * * *